United States Patent
Yoo

(10) Patent No.: US 9,088,007 B2
(45) Date of Patent: Jul. 21, 2015

(54) ORGANIC LIGHT EMITTING DIODE DISPLAY

(75) Inventor: Jae-Ho Yoo, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 39 days.

(21) Appl. No.: 13/585,818

(22) Filed: Aug. 14, 2012

(65) Prior Publication Data

US 2013/0248890 A1 Sep. 26, 2013

(30) Foreign Application Priority Data

Mar. 23, 2012 (KR) .................. 10-2012-0030132

(51) Int. Cl.
H01L 51/52 (2006.01)
H01L 51/56 (2006.01)

(52) U.S. Cl.
CPC ............ H01L 51/5256 (2013.01); H01L 51/56 (2013.01); *H01L 2251/562* (2013.01)

(58) Field of Classification Search
CPC ......... H01L 51/52; H01L 33/44; H01L 33/06; H01L 31/14; H01L 31/0232; H01L 33/04; H01L 33/00
USPC ............ 257/88, 40, 99, 84, 98; 313/506, 504, 313/498, 512
See application file for complete search history.

(56) References Cited

U.S. PATENT DOCUMENTS

| | | | |
|---|---|---|---|
| 2004/0012016 A1* | 1/2004 | Underwood et al. ........... 257/40 |
| 2006/0078677 A1* | 4/2006 | Won et al. .................. 427/248.1 |
| 2006/0246811 A1* | 11/2006 | Winters et al. .................. 445/25 |
| 2007/0080360 A1* | 4/2007 | Mirsky et al. .................. 257/99 |
| 2010/0227422 A1* | 9/2010 | Sasaki et al. .................... 438/26 |
| 2011/0063282 A1* | 3/2011 | Yoo ............................... 345/214 |
| 2012/0132930 A1* | 5/2012 | Young et al. .................... 257/84 |

FOREIGN PATENT DOCUMENTS

| | | |
|---|---|---|
| KR | 10-0462469 | 12/2004 |
| KR | 10-0626019 | 9/2006 |
| KR | 10-2008-0107220 A | 12/2008 |
| KR | 10-2010-0090888 A | 8/2010 |

OTHER PUBLICATIONS

Korean Patent Abstracts No. 10-2003-0082256 A for Patent No. KR 10-0462469, 2 pages.
Korean Patent Abstracts No. 10-2006-0033132 A for Patent No. KR 10-0626019, 2 pages.

* cited by examiner

*Primary Examiner* — Chuong A Luu
(74) *Attorney, Agent, or Firm* — Christie, Parker & Hale, LLP

(57) ABSTRACT

An organic light emitting diode (OLED) display is provided. The OLED display includes a substrate, an organic light emitting element on the substrate, and a thin film encapsulation layer on the substrate and covering the organic light emitting element. The thin film encapsulation layer includes at least one conductive layer having a voltage application pad.

13 Claims, 10 Drawing Sheets

ORGANIC LIGHT EMITTING DIODE DISPLAY

CROSS-REFERENCE TO RELATED APPLICATION

This application claims priority to and the benefit of Korean Patent Application No. 10-2012-0030132, filed in the Korean Intellectual Property Office on Mar. 23, 2012, the entire content of which is incorporated herein by reference.

BACKGROUND

1. Field

Aspects of embodiments of the present invention relate generally to an organic light emitting diode (OLED) display.

2. Description of the Related Art

An OLED display includes organic light emitting elements, each formed of a hole injection electrode (such as an anode), an organic emission layer, and an electron injection electrode (such as a cathode). Each OLED emits light by energy generated when excitons (that are created when electrons and holes are combined) drop from an excited state to a ground state. The OLED display displays an image by using the generated light.

The OLED display has self-luminance characteristics, and unlike a liquid crystal display (LCD), the thickness and weight of an OLED display can be reduced since a separate light source is not required. Further, because the OLED display has high quality characteristics such as low power consumption, high luminance, and high reaction speed, the OLED display is appropriate for use in a mobile electronic device.

Such an OLED display may experience a short-circuit problem in an anode and a cathode due to impurities such as particles. Accordingly, an aging or burning process may be added during a manufacturing process of the display device to eliminate the impurities. During the aging process, a shorting bar is formed by connecting data lines in one line and another shorting bar is formed by connecting scan lines in another line. After the aging process is performed, the shorting bars are disconnected.

However, the aging process is performed before the display device module is completed, such as before any thin film encapsulation. Thus, the aging process cannot be further performed to correct a failure generated due to fine particles that takes place after thin film encapsulation. Thus, a progressive failure is generated due to impurities such as non-eliminated fine particles.

The above information disclosed in this Background section is only for enhancement of understanding of the background of the present invention and therefore it may contain information that does not form the prior art that is already known in this country to a person of ordinary skill in the art.

SUMMARY

Aspects of embodiments of the present invention relate generally to an organic light emitting diode (OLED) display. More particularly, aspects of embodiments of the present invention relate to an OLED display that can perform aging after thin film encapsulation. Further aspects provide for an OLED display that can perform an aging process after completion of a module (panel or cell).

In an exemplary embodiment of the present invention, an organic light emitting diode (OLED) display is provided. The OLED display includes a substrate, an organic light emitting element on the substrate, and a thin film encapsulation layer on the substrate and covering the organic light emitting element. The thin film encapsulation layer includes at least one conductive layer having a voltage application pad.

The OLED display may further include a buffering layer between the organic light emitting element and the thin film encapsulation layer.

The organic light emitting element may include an electron injection layer (EIL). The buffering layer may include a same material as the EIL.

The buffering layer may include at least one of LiQ, LiF, and $WO_3$.

The thin film encapsulation layer may further include an oxide layer between the at least one conductive layer and the buffering layer.

The oxide layer may include an aluminum oxide.

The thin film encapsulation layer may further include at least one of an organic layer or an inorganic layer on the at least one conductive layer.

The at least one conductive layer may be formed using a sputtering method or a plasma coating method.

The at least one conductive layer may include at least one of aluminum, tungsten, copper, and molybdenum.

A thickness of the at least one conductive layer may be less than 200 Å.

The at least one conductive layer may include a transparent conductive layer.

A voltage applied to the voltage application pad may be less than 50 V.

The OLED display according to an exemplary embodiment forms a conductive layer for aging between a buffering layer and an organic layer for forming a thin film encapsulation layer so that impurities can be effectively eliminated. Accordingly, few or no progressive failures due to the impurities occur in the OLED display.

DETAILED DESCRIPTION

Figure 1:
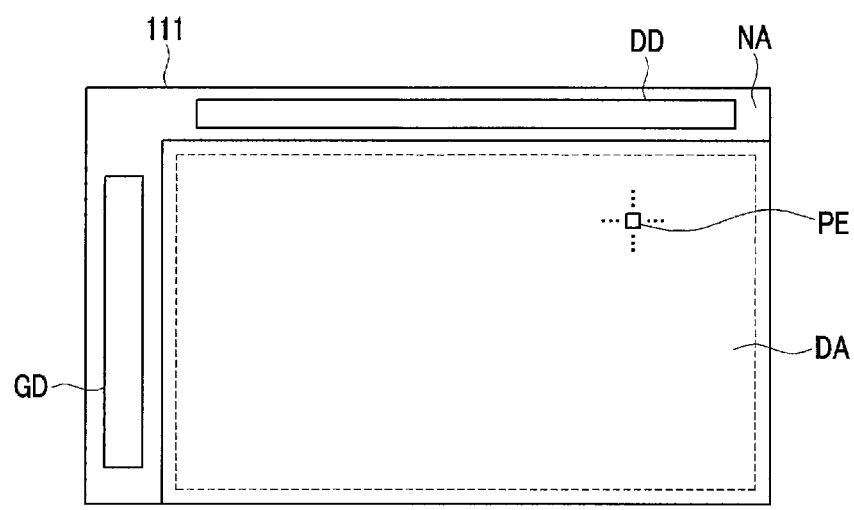
FIG. 1 is a schematic top plan view of a structure of an OLED display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Hereinafter, an organic light emitting diode (OLED) display according to exemplary embodiments will be described with reference to the drawings.

Figure 2:
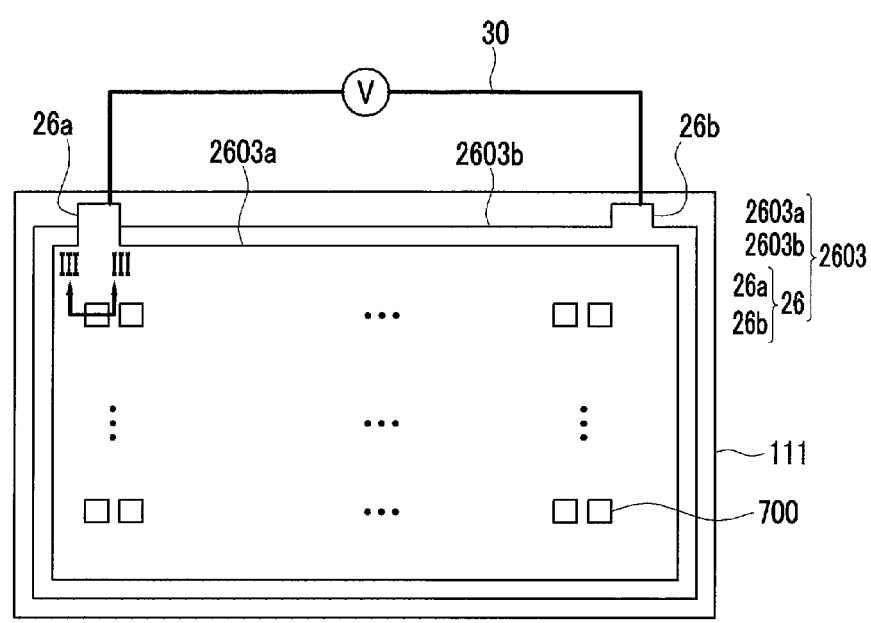
FIG. 2 is a schematic top plan view of a display area of the OLED display of FIG. 1.
Figure 3:
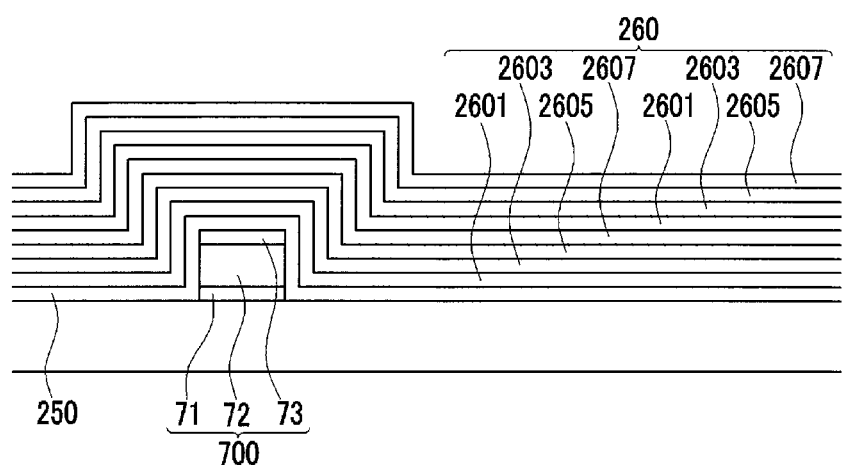
FIG. 3 is a cross-sectional view of FIG. 2, taken along the line III-III.

FIG. 1 is a schematic top plan view of a structure of an OLED display 101 according to an exemplary embodiment, FIG. 2 is a schematic top plan view of a display area DA of the OLED display 101 of FIG. 1, and FIG. 3 is a cross-sectional view of FIG. 2, taken along the line III-III.

As shown in FIG. 1, the OLED display 101 includes a substrate 111 divided into the display area DA and a non-display area NA. A plurality of pixels PE are formed in the display area DA of the substrate 111, and one of more driving circuits GD and DD are formed in the non-display area NA.

As shown in FIG. 2 and FIG. 3, the display area DA includes the substrate 111, an organic light emitting element 700 formed on the substrate 111, a buffering layer 250 formed on the organic light emitting element 700, and a thin film encapsulation layer 260 formed on the buffering layer 250. The organic light emitting element 700 is driven by a wiring portion including a thin film transistor (see FIG. 7) formed on the substrate 111.

The substrate 111 includes one or more of polymer, quartz, glass, metal, or the like, and is formed of a light transmissive material. The organic light emitting element 700 includes a first electrode 71, an organic emission layer 72, and a second electrode 73.

The buffering layer 250 is disposed between the organic light emitting element 700 and the thin film encapsulation layer 260 to protect the organic light emitting element 700 when the thin film encapsulation layer 260 is formed. The buffering layer 250 may be formed of a material that can be formed through an organic vapor deposition method like the organic emission layer 72. The material may be a material that forms an electron transport layer (ETL) of the organic light emitting element 700. For example, the material may include at least one of LiF, $WO_3$, and LiQ.

The thin film encapsulation layer 260 is an encapsulating member that encapsulates the organic light emitting element 700, and formed by layering at least one of an inorganic layer 2605, an organic layer 2607, a conductive layer 2603, and an oxide layer 2601. For example, the oxide layer 2601, the conductive layer 2603, the inorganic layer 2605, and the organic layer 2607 may be sequentially layered on the buffering layer 250, and the layering may be repeated two or more times as necessary. In addition, the oxide layer 2601 and the conductive layer 2603 are sequentially layered in that order in FIG. 3, but the conductive layer 2603 and the oxide layer 2601 may be sequentially layered in the other order in other embodiments. In the exemplary embodiment of FIG. 2 and FIG. 3, two of each of the layers are respectively formed, but one of each layer, or three or more of each layer may be formed in other embodiments.

The oxide layer 2601 may be, for example, an aluminum oxide. The conductive layer 2603 may include at least one of aluminum, tungsten, copper, and molybdenum. In addition, the conductive layer 2603 may include instead (or in addition to) a transparent conductive layer such as indium tin oxide. To form a conductive layer formed of an opaque metal, each layer should be sufficiently thin, for example, have a thickness of less than 50 Å, for light transmission. In addition, the entire thickness of the conductive layer 2603 should also be sufficiently thin, for example, less than 200 Å, to permit light transmission when the conductive layer 2603 is layered in plural.

The conductive layer 2603 includes an application pad 26 for application of a voltage. The conductive layer 2603 may be layered in plural, and in this case, the application pad 26 is not overlapped as shown in FIG. 2. For convenience in description, a conductive layer 2603 having an application pad 26 on the left side (e.g., odd side) is referred to as a first conductive layer 2603a and a first application pad 26a, respectively, while a conductive layer 2603 having an application pad 26 on the right side (e.g., even side) is referred to as a second conductive layer 2603b and a second application pad 26b, respectively.

When the conductive layer 2603 is formed as in the exemplary embodiment of FIG. 1 to FIG. 3, impurities generated during a manufacturing process of the OLED display 101 can be effectively eliminated. In further detail, the first application pad 26a and the second application pad 26b are electrically connected to respective voltage sources through a voltage line 30, and the first conductive layer 2603a and the second conductive layer 2603b apply voltages, for example, constant voltages. The constant voltages may be DC or AC voltages. For example, the voltage between the first conductive layer 2603a and the second conductive layer 2603b may be some voltage lower than 50 V for burning the impurity when the constant voltages are DC voltages. In some embodiments, one of the first conductive layer 2603a or the second conductive layer 2603b may be formed as an additional ground line or as a ground electrode for supplying a ground voltage.

As described, when a voltage of, for example, several tens of volts is applied to the first and second conductive layers 2603a and 2603b, an electric field of several tens of volts is formed in the impurity and thus, the impurity is burned. Accordingly, the impurity in the thin film encapsulation layer 260 can be easily eliminated. Thus, a process for eliminating the impurity in the thin film encapsulation layer 260 can be performed after the thin film encapsulation process is completed in the manufacture of the OLED display 101.

Hereinafter, a method for manufacturing the conductive layer 2603 of FIG. 2 will be described in further detail with reference to FIG. 4A to FIG. 4D and FIG. 5.

Figure 4A:
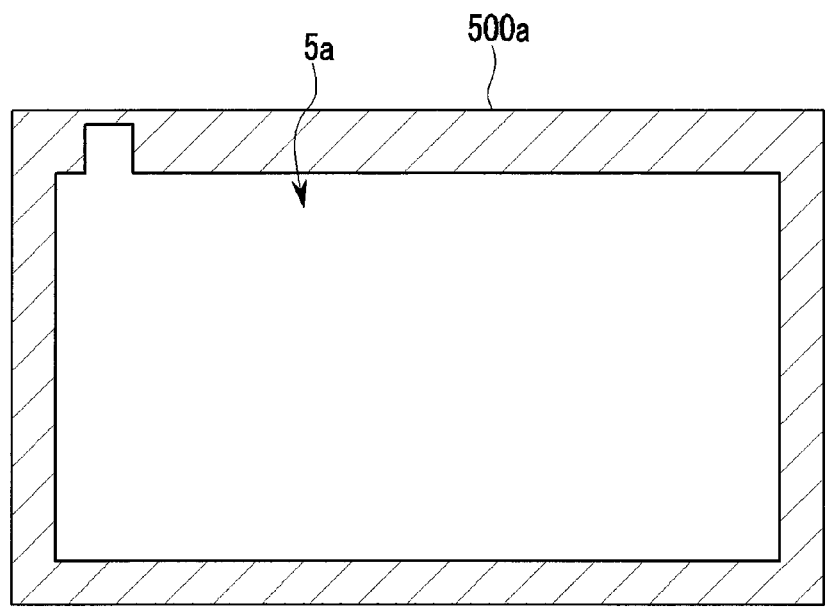
FIG. 4A to FIG. 4D sequentially illustrate masks used to iteratively form a conductive layer of a thin film encapsulation layer according to an exemplary embodiment.
Figure 4B:
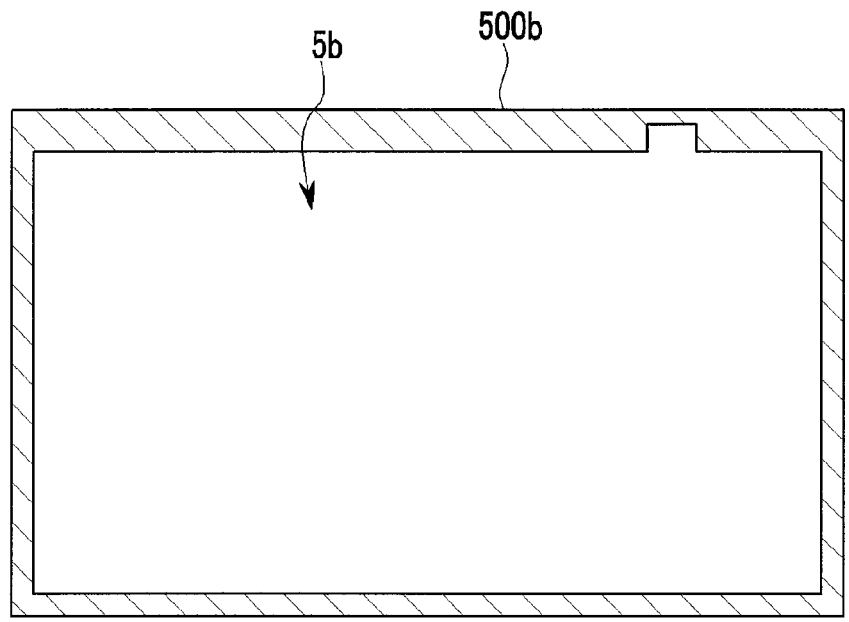
Figure 4C:
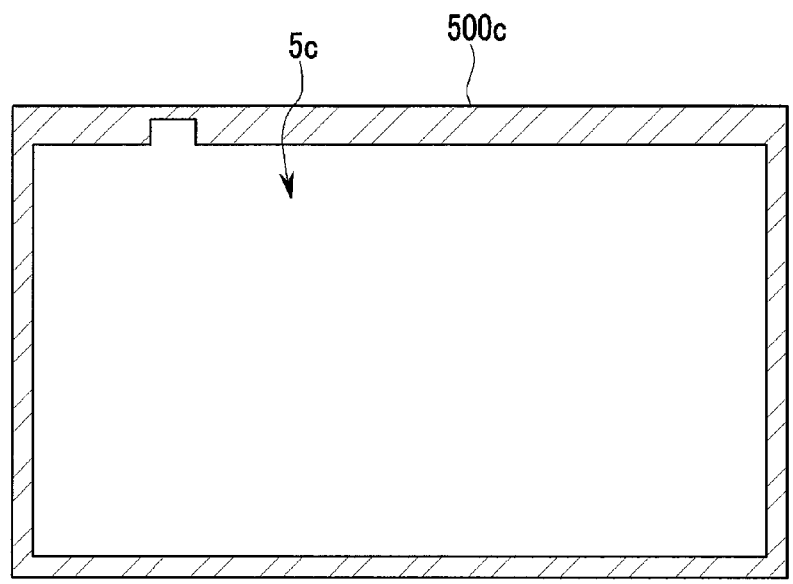
Figure 4D:
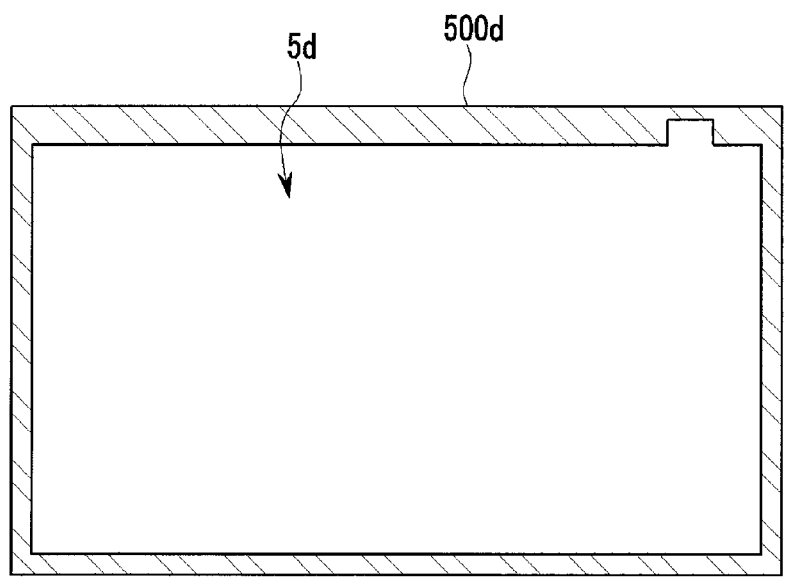
Figure 5:
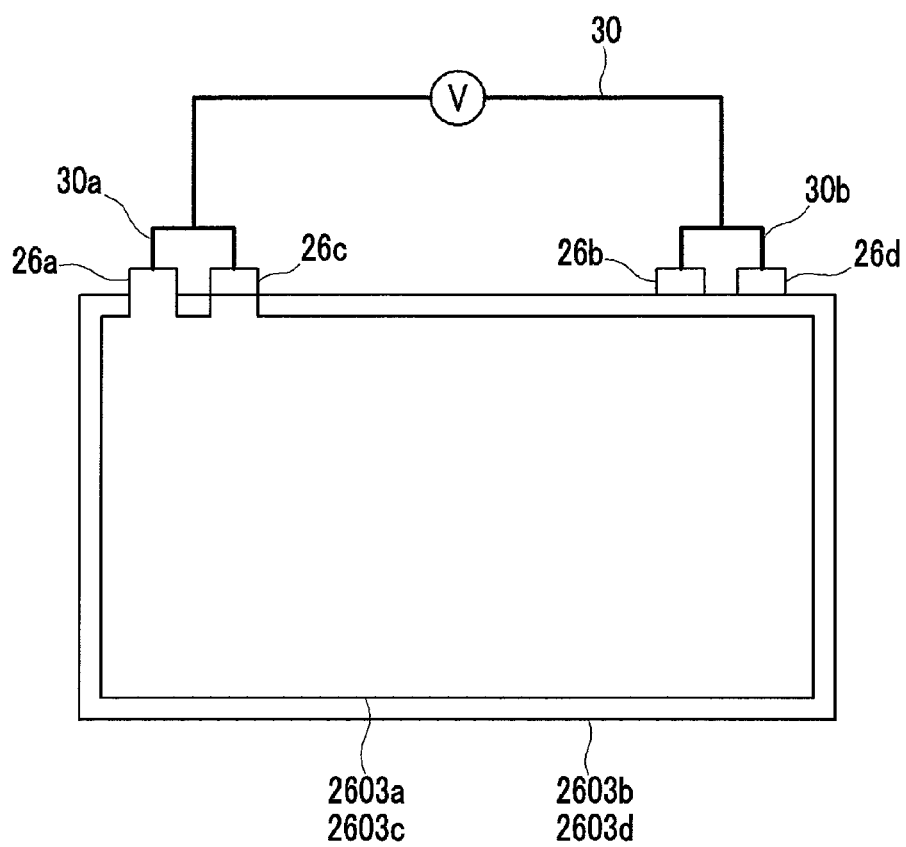
FIG. 5 is a schematic layout view of the conductive layer formed using the masks of FIG. 4A to FIG. 4D.

FIG. 4A to FIG. 4D sequentially show masks used to iteratively form the conductive layer 2603 of the thin film encapsulation layer 260 according to an exemplary embodiment, and FIG. 5 is a schematic layout view of the conductive layer 2603 formed using the masks of FIG. 4A to FIG. 4D.

In FIG. 2, two conductive layers, specifically the first conductive layer 2603a and the second conductive layer 2603b, are formed in the OLED display. However, in the exemplary embodiment of FIG. 4 and FIG. 5, four conductive layers 2603 are exemplarily formed. For convenience in description, reference numerals a, b, c, and d are sequentially added according to an order of forming the conductive layer 2603.

First, as shown in FIG. 4A and FIG. 5, a first mask 500a is disposed on the substrate and then the first conductive layer 2603a is formed on the substrate using, for example, a sputtering method or a plasma coating method. A first opening 5a having the same shape as the first conductive layer 2603a, including the first application pad 26a, is formed in the first mask 500a. The first opening 5a is disposed to correspond to the display area DA (refer to FIG. 1), excluding an edge driver of the OLED display 101.

Then, an inorganic layer, an organic layer, and an oxide layer are sequentially layered. The layering order may be changed as necessary. Since the inorganic layer, the organic layer, and the oxide layer do not include the first application pad 26a, they can be formed using masks used to form corresponding organic and inorganic layers, and they are not layered on the first application pad 26a.

Next, as shown in FIG. 4B and FIG. 5, the second mask 500b is disposed and then the second conductive layer 2603b is formed on the oxide layer through, for example, sputtering or plasma coating. The second mask 500b includes a second opening 5b that is the same as the second conductive layer 2603b, including the second application pad 26b. In addition, an inorganic layer, an organic layer, and an oxide layer are sequentially layered. The layering order may be changed as necessary.

Then, as shown in FIG. 4C and 5, the third conductive layer 2603c is formed on the oxide layer where a third mask 500c having a third opening 5c is disposed, and then an inorganic layer, an organic layer, and an oxide layer are formed. Then, as shown in FIG. 4D and FIG. 5, a fourth mask 500d having a fourth opening 5d is disposed on the oxide layer and then the fourth conductive layer 2603d is formed. After that, an organic layer and an inorganic layer may be additionally formed.

Meanwhile, as shown in FIG. 5, when four or more of conductive layers are formed, odd-numbered application pads 26a and 26c are electrically connected with each other through a wire 30a and even-numbered application pads 26b and 26d are electrically connected with each other through a wire 30b and then a constant voltage can be applied through the voltage line 30. That is, the even-numbered application pads 26b and 26d are connected with a positive (+) electrode and the odd-numbered application pads 26a and 26c are connected with a negative (−) electrode such that the entire thin film encapsulation layer 260 can be aged at the same time.

In the above-described exemplary embodiment, the conductive layer 2603 is formed to correspond to the display area DA (refer to FIG. 1), excluding the edge driver of the display device, but the conductive layer may be formed only in an area, excluding an area that corresponds to an organic emission layer 72 of an organic light emitting element 700 of each pixel PE of the display device. Thus, light efficiency of the OLED display 101 can be increased, for example, by using a photosensitive pattern that is formed only on the organic emission layer 72, and then the photosensitive pattern may be eliminated by etching.

Hereinafter, the OLED display 101 including the thin film encapsulation layer 260 will be described in further detail, focusing on a pixel PE.

Figure 6:
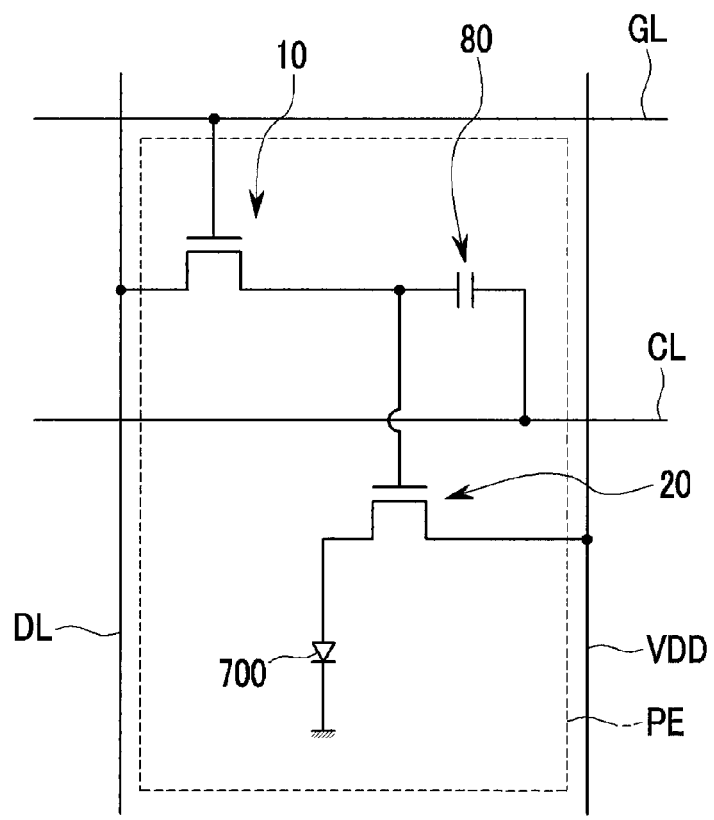
FIG. 6 is an equivalent circuit diagram of a pixel circuit of the OLED display of FIG. 1 according to an exemplary embodiment.

FIG. 6 is an equivalent circuit diagram of a pixel circuit of the OLED display 101 of FIG. 1 according to an exemplary embodiment.

As shown in FIG. 6, one pixel PE has a 2Tr-1Cap (two transistor, one capacitor) structure with an organic light emitting element (for example, an OLED) 700, two thin film transistors (TFTs) 10 and 20, and a capacitor 80. However, the present invention is not limited thereto. The OLED display 101 may be variously structured such that three or more thin film transistors and two or more capacitors are provided at one pixel PE together with corresponding control wiring. The additional thin film transistor and capacitors may form, for example, a compensation circuit.

The compensation circuit improves the uniformity of the OLED 700 formed at each pixel PE, and prevents the image quality from varying. The compensation circuit may include, for example, two to eight thin film transistors. Furthermore, driving circuits GD and DD (see FIG. 1) formed in the non-display area NA of the substrate 111 may include additional thin film transistors.

The OLED 700 includes an anode functioning as a hole injection electrode, a cathode functioning as an electron injection electrode, and an organic emission layer 72 (see FIG. 3) disposed between the anode and the cathode. The anode and the cathode may be the first electrode and the second electrode, respectively or vice versa, of FIG. 3.

In the exemplary embodiment of FIG. 6, one pixel PE includes a first thin film transistor 10 and a second thin film transistor 20. The first thin film transistor 10 and the second thin film transistor 20 respectively include gate electrodes, semiconductor layers, source electrodes, and drain electrodes. In addition, a semiconductor layer of at least one of the first thin film transistor 10 and the second thin film transistor 20 includes an impurity-doped polycrystalline silicon layer. That is, at least one thin film transistor of the first thin film transistor 10 and the second thin film transistor 20 is a polysilicon thin film transistor.

FIG. 6 illustrates a gate line GL, a data line DL, a common power line VDD, and a capacitor line CL. However, the capacitor line CL may be omitted in other embodiments. A source electrode of the first thin film transistor 10 is connected to the data line DL, and a gate electrode of the first thin film transistor 10 is connected to the gate line GL. In addition, a drain electrode of the first thin film transistor 10 is connected to the capacitor line CL through the capacitor 80. A node is formed between the drain electrode of the first thin film transistor 10 and the capacitor 80 so that a gate electrode of the second thin film transistor 20 is connected thereto. In addition, the common power line VDD is connected to a source electrode of the second thin film transistor 20 and a drain electrode thereof is connected with the anode of the organic light emitting element 700.

The first thin film transistor 10 is used as a switching electrode that selects a pixel PE for light emission. When the first thin film transistor 10 is turned on, the capacitor 80 is charged and the amount of charge is proportional to a potential of a voltage applied from the data line DL. In addition, when a voltage increasing signal is input to the capacitor line CL with one frame cycle while the first thin film transistor 10 is turned off, a gate potential of the second thin film transistor 20, with reference to the potential charged in the capacitor 80, rises according to the voltage that is applied through the capacitor line CL. Then, the second thin film transistor 20 is turned on when the gate potential exceeds a threshold voltage. Afterwards, the voltage applied to the common power line VDD is applied to the organic light emitting element 700 through the second thin film transistor 20 and the organic light emitting element 700 emits light.

Hereinafter, an interlayer configuration of one pixel PE of the OLED display 101 according to the exemplary embodiment of FIG. 1 to FIG. 3 will be described in further detail with reference to FIG. 7.

Figure 7:
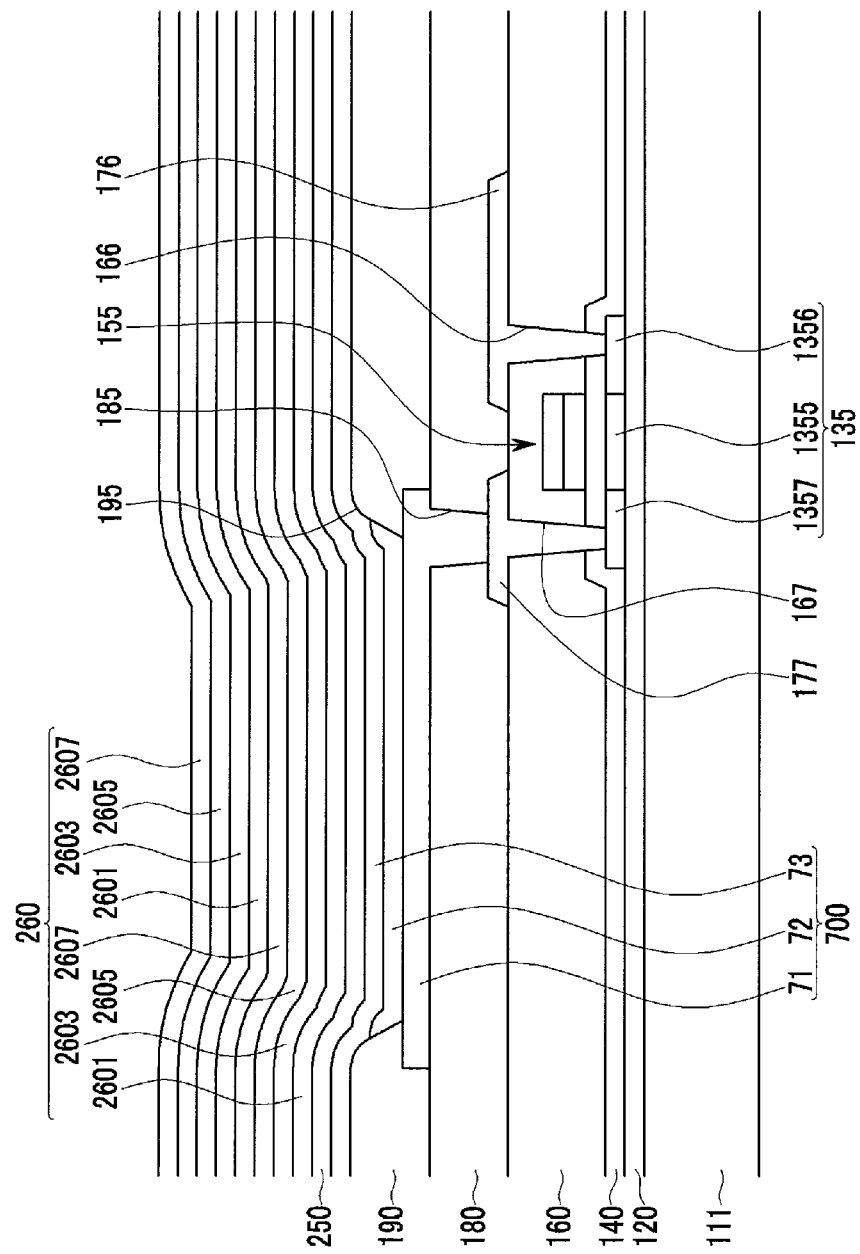
FIG. 7 is a cross-sectional view of the OLED display of FIG. 1.

FIG. 7 is a cross-sectional view of the OLED display 101 of FIG. 1.

FIG. 7 illustrates the second thin film transistor 20 of FIG. 6 and the organic light emitting element 700 of FIG. 2 according to a layering order. Hereinafter, the second thin film transistor 20 is referred to as a thin film transistor.

The substrate 111 may be an insulating substrate formed of glass, quartz, ceramic, or the like. A lower buffering layer 120 is formed on the substrate 111 to prevent permeation of undesired components such as an impurity or moisture and at the same time flatten the surface thereof.

A semiconductor 135 formed of polycrystalline silicon is formed on the lower buffering layer 120. The semiconductor 135 is divided into a channel area 1355, along with a source area 1356 and a drain area 1357 formed on respective sides of the channel area 1355. The channel area 1355 of the semiconductor 135 is polycrystalline silicon not doped with particles, that is, an intrinsic semiconductor. The source area 1356 and the drain area 1357 of the semiconductor 135 are polycrystalline silicon doped with a conductive impurity, that is, impurity semiconductors. The impurity doped to the source area 1356 and the drain area 1357 may be one of a p-type impurity and an n-type impurity.

A gate insulating layer 140 is formed on the semiconductor 135. The gate insulation layer 140 may be a single layer or a multiple layer including at least one of tetra ethyl ortho silicate (TEOS), silicon nitride, and silicon oxide. A gate electrode 155 is formed on the gate insulating layer 140. The gate electrode 155 overlaps the channel area 1355.

An interlayer insulating layer 160 is formed on the gate electrode 155. Like the gate insulation layer 140, the interlayer insulation layer 160 may be formed of tetra ethyl ortho silicate (TEOS), silicon nitride, or silicon oxide. The interlayer insulating layer 160 and the gate insulating layer 140 include a source contact hole 166 and a drain contact hole 167 respectively exposing the source area 1356 and the drain area 1357.

A source electrode 176 and a drain electrode 177 are formed on the interlayer insulating layer 160. The source electrode 176 is connected with the source area 1356 through the source contact hole 166, and the drain electrode 177 is connected with the drain area 1357 through the drain contact hole 167. A protective layer 180 is formed on the interlayer insulating layer 160. The protective layer 180 includes a contact hole 185 exposing the drain electrode 177.

A pixel electrode 71 is formed on the protective layer 180 and connected with the drain electrode 177 through the contact hole 185. The pixel electrode 71 may be the first electrode 71 of FIG. 3, and may be an anode of the organic light emitting element 700.

A pixel defining layer 190 is formed on the pixel electrode 71. The pixel defining layer 190 includes an opening 195 exposing the pixel electrode 71. The pixel defining layer 190 may be formed by including a resin such as polyacrylates or polyimides and a silica-based inorganic material.

An organic emission layer 72 is formed in the opening 195 of the pixel defining layer 190. The organic emission layer 72 may be formed as a multi-layer including one or more of an organic light emission layer (EML), a hole injection layer (HIL), a hole transport layer (HTL), an electron transport layer (ETL), and an electron injection layer (EIL). If the organic emission layer 72 includes all of these layers, the hole injection layer is disposed on the pixel electrode 71, on which the hole transport layer, the organic light emission layer, the electron transport layer, and the electron injection layer are then sequentially stacked.

A common electrode 73 is formed on the pixel defining layer 190 and the organic emission layer 72. The common electrode 73 may be the second electrode 73 of FIG. 2, and may be a cathode of the organic light emitting element 700. Thus, the pixel electrode 71, the organic emission layer 72, and the common electrode 73 form the organic light emitting element 700.

The OLED display 101 may be structured in any one of a front display type, a rear display type, and a one-panel dual display type, depending upon the light-emitting direction of the OLED 700. If the OLED display 101 is structured as the front display type, the pixel electrode 71 may be formed with a reflective film and the common electrode 73 may be formed with a semitransparent film. If the OLED display 101 is structured as the rear display type, the pixel electrode 71 may be formed with a semitransparent film and the common electrode 73 may be formed with a reflective film. If the OLED display 101 is structured as the one panel dual display type, each of the pixel electrode 71 and the common electrode 73 may be formed with a transparent film or a semitransparent film.

The reflective film and the semitransparent film are formed with at least one metallic material selected from magnesium (Mg), silver (Ag), gold (Au), calcium (Ca), lithium (Li), chromium (Cr), aluminum (Al), and alloys thereof. Whether a given film is a reflective film or a semitransparent film is determined depending upon the thickness thereof. The semitransparent film usually has a thickness of 200 nm or less. With the semitransparent film, the smaller the thickness is, the more light transmittance is increased and the more resistance is increased. The transparent film is formed with indium tin oxide (ITO), indium zinc oxide (IZO), zinc oxide (ZnO), or indium oxide ($In_2O_3$).

The buffering layer 250 is formed on the common electrode 73, and the thin film encapsulation layer 260 is formed on the buffering layer 250. The buffering layer 250 may be formed of the same material of the electron injection layer (EIL) of the organic light emitting element, and may include at least one of LiF, $WO_3$, and LiQ. When the buffering layer is formed of the electron injection layer (EIL), light efficiency of the OLED display 101 can be increased.

As shown in FIG. 3, the oxide layer 2601 formed on the buffering layer 250, the conductive layer 2603 formed on the oxide layer 2601, and the inorganic and organic layers 2605 and 2607 formed on the conductive layer are each layered two times such that the thin film encapsulation layer 260 is formed. In other embodiments, the conductive layer 2603 and then the oxide layer 2601 may be layered on the buffering layer 250.

When the thin film encapsulation layer 260 is formed including the conductive layer 2603 as in the exemplary embodiment of FIG. 1 to FIG. 3, an impurity can be easily eliminated by applying a constant voltage (for example, a voltage less than 50 V) to the conductive layer 2603.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

| <Description of some symbols> | |
|---|---|
| 5a: first opening | 5b: second opening |
| 5c: third opening | 5d: fourth opening |
| 10: first thin film transistor | 20: second thin film transistor |
| 26: application pad | 26a: first application pad |
| 26b: second application pad | 26c: third application pad |
| 26d: fourth application pad | 30: voltage line |
| 30a, 30b: wire | 71: pixel electrode |
| 72: organic emission layer | 73: common electrode |
| 80: capacitor | 101: OLED display |
| 111: substrate | |
| 120: lower buffering layer | 135: semiconductor |
| 140: gate insulating layer | 155: gate electrode |
| 160: interlayer insulating layer | 166: source contact hole |
| 167: drain contact hole | 176: source electrode |
| 177: drain electrode | 180: protective layer |
| 190: pixel defining layer | 195: opening |
| 250: buffer layer | 260: thin film encapsulation layer |
| 500a: first mask | 500b: second mask |
| 500c: third mask | 500d: fourth mask |
| 700: organic light emitting element | 1355: channel area |
| 1356: source area | 1357: drain area |

-continued

<Description of some symbols>

| | |
|---|---|
| 2601: oxide layer | 2603: conductive layer |
| 2603a: first conductive layer | 2603b: second conductive layer |
| 2603c: third conductive layer | 2603d: fourth conductive layer |
| 2605: inorganic layer | 2607: organic layer |

What is claimed is:

1. An organic light emitting diode (OLED) display comprising:
 a substrate;
 an organic light emitting element on the substrate and comprising a first electrode, an organic emission layer on the first electrode, and a second electrode on the organic emission layer; and
 a pair of thin film conductive encapsulation layers sequentially formed on and encapsulating the organic light emitting element, each of the thin film conductive encapsulation layers having a voltage application pad.

2. The OLED display of claim 1, further comprising a buffering layer between the organic light emitting element and the thin film conductive encapsulation layers.

3. The OLED display of claim 2, wherein
 the organic light emitting element further comprises an electron injection layer (EIL), and
 the buffering layer comprises a same material as the EIL.

4. The OLED display of claim 3, wherein the buffering layer comprises at least one of LiQ, LiF, and $WO_3$.

5. The OLED display of claim 2, further comprising an oxide layer between at least one of the thin film conductive encapsulation layers and the buffering layer.

6. The OLED display of claim 5, wherein the oxide layer comprises an aluminum oxide.

7. The OLED display of claim 2, further comprising at least one of an organic layer or an inorganic layer on at least one of the thin film conductive encapsulation layers.

8. The OLED display of claim 1, wherein at least one of the thin film conductive encapsulation layers is formed on the organic light emitting element using a sputtering method or a plasma coating method.

9. The OLED display of claim 8, wherein the at least one of the thin film conductive encapsulation layers comprises at least one of aluminum, tungsten, copper, and molybdenum.

10. The OLED display of claim 9, wherein a thickness of the at least one of the thin film conductive encapsulation layers is less than 200 Å.

11. The OLED display of claim 8, wherein the at least one of the thin film conductive encapsulation layers comprises a transparent conductive layer.

12. The OLED display of claim 1, wherein the thin film conductive encapsulation layers are configured to receive a voltage difference applied to the voltage application pad of each of the thin film conductive encapsulation layers that is less than 50 V (volts) to burn impurities between the thin film conductive encapsulation layers.

13. The OLED display of claim 12, wherein the voltage difference is at least several tens of volts.

* * * * *